United States Patent [19]
Hibbs et al.

[11] Patent Number: 5,973,771
[45] Date of Patent: Oct. 26, 1999

[54] PUPIL IMAGING RETICLE FOR PHOTO STEPPERS

[75] Inventors: Michael Straight Hibbs, Westford; Dean Craig Humphrey; Grant Neven Pealer, III, both of Jericho; Barbara Bates Peck, Westford, all of Vt.

[73] Assignee: International business Machines Corporation, Armonk, N.Y.

[21] Appl. No.: 08/824,385

[22] Filed: Mar. 26, 1997

[51] Int. Cl.[6] ................ G01J 1/00; G01J 1/32; G01R 11/00

[52] U.S. Cl. .............. 356/121; 356/400; 356/401; 250/205

[58] Field of Search ................ 356/400, 401, 356/121; 353/55; 250/205, 548

[56] References Cited

U.S. PATENT DOCUMENTS

| | | |
|---|---|---|
| 4,000,949 | 1/1977 | Watkins . |
| 5,300,967 | 4/1994 | Kamon . |
| 5,420,417 | 5/1995 | Shiraishi .................. 356/121 |
| 5,461,456 | 10/1995 | Michalosk . |

FOREIGN PATENT DOCUMENTS

| | | |
|---|---|---|
| 60-211306 | 10/1985 | Japan . |
| 2-257011 | 10/1990 | Japan . |

*Primary Examiner*—Frank G. Font
*Assistant Examiner*—Roy M. Punnoose
*Attorney, Agent, or Firm*—Schmeiser, Olsen & Watts; Mark F. Chadurjian

[57] ABSTRACT

The invention relates to the evaluation of the pupil illumination profile in a projection lithography system using an imaging reticle featuring a plurality of holes of few microns in diameter. The imaging reticle is placed at the lens object plane and a photoresist coated substrate is exposed in a defocused position from the lithographic image plane. The image reticle has a plurality of identical holes that are regularly spaced at predetermined distances for a more detailed evaluation of the effective pupil illumination across the entire exposure field.

18 Claims, 5 Drawing Sheets

PUPIL IMAGING RETICLE FOR PHOTO STEPPERS

BACKGROUND OF THE INVENTION

1. Technical Field

The present invention relates to photo lithographic lens systems and, more specifically, to a method and apparatus for obtaining quantitative measurements of the pupil plane illumination across the entire exposure field.

2. Background Art

Optical photolithography has been widely used in the semiconductor industry in connection with the formation of a wide range of structures in integrated circuit (IC) chips. Complex forms of pupil illumination patterns have become increasingly common for the purpose of improving resolution or depth of focus. The ability to measure and verify the correct distribution of illumination in the pupil plane has become increasingly critical.

Uniformity of the illumination at the wafer surface is required so that the same exposure of photoresist or other light sensitive films is consistently achieved across the entire exposure field. The degree of partial incoherency of the illumination, or more generally the distribution of pupil illumination, must also be constant across the entire exposure field. As tolerances of the printed lithographic patterns become increasingly tight, the requirement that the pupil illumination distribution not vary across the exposure field becomes increasingly important.

Various illumination systems for lithographic lenses have been developed, including those that create complex patterns of pupil illumination to enhance lithographic resolution and/or depth of focus. Illumination patterns, such as dipole, quadrupole, and annular shapes, have been developed to improve the resolution and depth of focus of the image formation. Some of these illumination patterns are particularly suited to enhancing the lithographic performance of specific mask patterns that are exposed on the stepper. When conventional partially coherent illumination is used, the center of the pupil is illuminated uniformly out to a prescribed fraction of the pupil size. In the case of both conventional partially coherent illumination and the more complex off-axis illumination patterns, the consistency of the illumination pattern at every position in the exposure field is critical.

Several techniques have been developed to adjust the uniformity and coherence of the illumination in lithographic exposure systems. For example, a spatial uniformity adjuster that can compensate for factors tending to deviate the illumination from uniformity is disclosed in U.S. Pat. No. 5,461,456 issued to Michaloski. An adjustable optical member that is refractive moves axially with respect to the lithography lens next to the pupil of the illuminator to help adjust the spatial uniformity of the illumination. Another method using a projection exposure apparatus that can change the coherency of the illumination is disclosed in U.S. Pat. No. 5,300,967 issued to Kamon. A reticle having openings for shaping light emitted from the light source and shielding patterns in order to reduce the area of the aperture, and thus affecting the coherency of the illumination, is used. In conjunction with these improved methods of adjusting the illumination, however, comes the need to measure and analyze the illumination patterns more carefully, to ensure that uniformity and consistency across the entire exposure field is achieved, and that the equipment is working properly and without defects.

The quality and uniformity of the illumination at the wafer plane can be analyzed and characterized by a variety of techniques, including wafer-plane power meters, analysis of photoresist or other light-sensitive films, etc. Measurement of the illumination pattern at the pupil plane(s) of the lithographic lens, however, is more difficult. Direct access to the entrance or exit pupil planes, or other planes optically conjugated to these planes, is usually not possible. For telecentric lithographic lenses, the pupils are virtual planes located at infinity. In the past, the pupil illumination has been measured by using a single, relatively large (one to a few millimeters), aperture in the plane of the photomask, this aperture flnction as a pinhole camera and projecting a geometrical image of the pupil illumination pattern. In order to capture this image with good resolution, the recording medium must be moved far enough away (several centimeters) from the wafer plane, which is the normal focal plane of the lithographic lens. Often the wafer chucking assembly must be removed in order to place the image-recording medium far enough from the focal plane to capture a good-quality image of the pupil illumination. Because of the large magnification of the image formed by this pin-hole camera technique, the intensity of the image is very low, and very sensitive recording mediums and/or long exposure times are needed. Also, because of the large magnification of the illumination pattern, typically only one pin hole image at a time can be formed within the exposure field of the lithographic lens. To test the pupil illumination pattern in several parts of the exposure field, the images and measurements would have to be made one at a time, since the images would overlap if two or more pinholes were present simultaneously in the exposure field.

Therefore, a need exists for a system that can efficiently obtain quantitative measurements of the illumination pattern at the pupil plane of the lithographic lens, so that analysis and verification of its regularity across the entire exposure field can be achieved.

SUMMARY OF THE INVENTION

The present invention relates to a method and apparatus for measuring and analyzing the illumination pattern at the pupil plane of the lithographic lens, using a pupil imaging reticle having a plurality of holes through which the illumination can be projected onto a standard wafer to be captured on the photoresist using normal lithographic processes. The images that are formed on the wafer can be used to measure and analyze the uniformity of the pupil illumination and to ensure that the proper distribution of pupil illumination is provided across the entire exposure field.

The pupil imaging reticle is provided with a plurality of small holes each having a predetermined size and shape, or diameter, and spaced a predetermined distance apart. The optimum size of the holes is determined in conjunction with the degree to which the image projection is required to be defocused on the wafer plane to give the best resolution. To obtain information regarding the uniformity of the pupil illumination and distribution of the angles of projection through the lithographic lens, it is important to place the exposure field or wafer plane away from the focal plane, so that the image becomes defocused. Were the exposure field placed directly at the focal plane, the image would be in focus, and merely duplicate the image of the holes on the reticle, and therefore, little or no additional information regarding the illumination spread angles, degree of coherency and other diffraction characteristics, could be derived. The preferred size of the holes is such that, at the predetermined amount of defocus, the geometrical blurring, which is due to the holes being too large, and the diffractive blurring, which is due to the holes being too small, are equal.

The size of the holes can also affect the amount of exposure that is needed to provide good resolution. The preferred amount of exposure is also a function of the amount of defocus that is used, in that the needed exposure time will increase as the square of the amount of defocus. Accordingly, the higher the amount of defocus, and the smaller the size of the holes, the greater the exposure will have to be. The resolution of the pupil image created in this manner will be improved with an increasing amount of defocus distance. It should be noted, however, that even with low resolution, the present invention can be used adequately, so long as there is enough resolution to be able to compare the pupil images formed on the wafer. The present invention can be used within a range of hole sizes and defocus amounts, although there are optimum values, as will be discussed.

The spacing of the holes is preferably such that the holes are positioned throughout the reticle to create images across the entire exposure field, thereby providing sufficient sampling density. Sufficient sampling is needed because the design of lithographic projection lenses and illuminators makes it possible for the effective pupil illumination to vary from one position in the exposure field to another. The holes in the preferred embodiment are placed in rows across the reticle wherein the holes are preferably, but not necessarily, equidistance apart from one another, with the rows also being substantially the same equidistance apart. Actual placement of the holes on the reticle in this manner, or in any specific pattern, is, however, not required. So long as there is enough sampling density, the holes can be placed randomly, or in other patterns, throughout the reticle without adversely affecting the test results. The holes, however, are preferably far enough apart so that the images, taking into account the magnification caused by the distribution of illuminating angles, do not interfere with one another. They are also preferably spaced enough apart so that multiple dose images can be recorded within the same exposure field at stepped intervals.

An advantage of the present invention is that standard wafers and normal lithographic processes can be used to measure and analyze the illumination patterns on the pupil plane. The projected images are also cast simultaneously across the entire exposure field, to determine whether the pupil illumination is constant and/or uniform throughout. This process does not require the wafer assembly to be removed and replaced each time which is often required using previous measuring methods.

With the increasing use of complex forms of pupil illumination, including adjustable illumination lithographic lens systems and varied illumination patterns, such as dipole, quadrupole, and annular shapes, the present invention provides valuable on-the-spot quantitative measurements and analysis to ensure that the equipment being used is operating in the intended manner. Defects in the pupil or in any other part of the lens system that has an effect on the consistency of the illumination across the entire exposure field can be discovered quickly. Accurate and efficient measurements to help the user determine if the equipment is operating properly are provided by recorded images that are projected directly onto the wafer chip for easy and fast analysis.

BRIEF DESCRIPTION OF THE DRAWINGS

FIG. 2A is taken from A—A on FIG. 2, and FIG. 2B is taken from B on FIG. 2A.

DETAILED DESCRIPTION OF THE INVENTION

Figure 1:
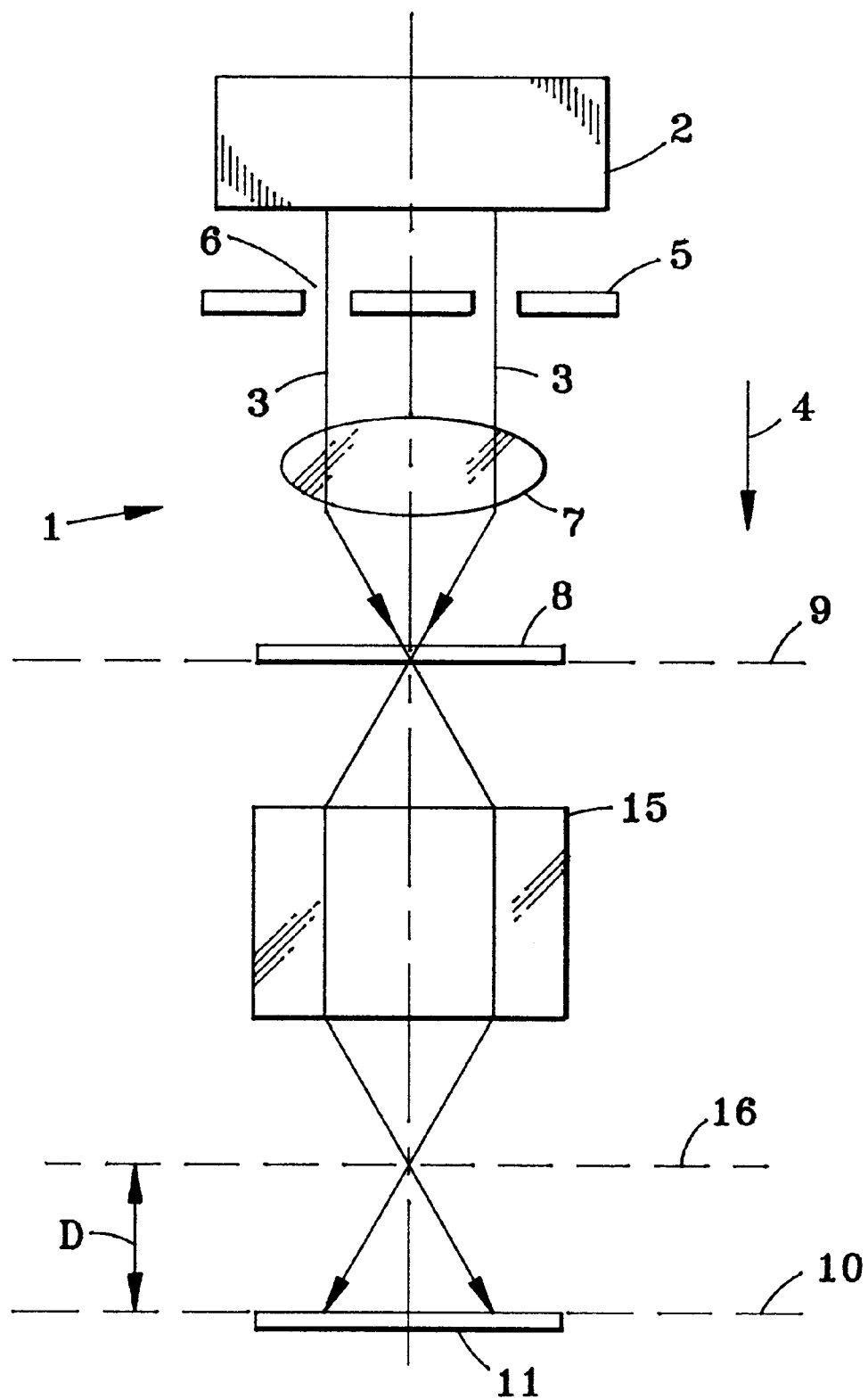
FIG. 1 is a schematic diagram showing the photo lithographic lens system of the present invention having an off-axis illumination pattern and a pupil imaging reticle positioned at the first focal plane, with the wafer plane defocused.

The present invention comprises a pupil imaging reticle that is intended to be used in conjunction with virtually any conventional or non-conventional photo lithographic lens system. The system 1 can generally be assembled in the manner shown in FIG. 1, wherein there is an illuminator source 2 which directs its light 3 substantially in the direction of arrow 4. An aperture stop 5 can be provided which partially blocks the light, although no aperture stop at all is required. The aperture stop 5 can have a conventional on-axis opening, or one or more off-axis openings 6, as shown in FIG. 1, wherein the opening(s) can be in any pattern that provides the desired effects. The opening can have a dipole, quadrupole or annular pattern, or any other suitable pattern, which directs the light toward the condenser lens 7 in the appropriate manner.

Figure 2:
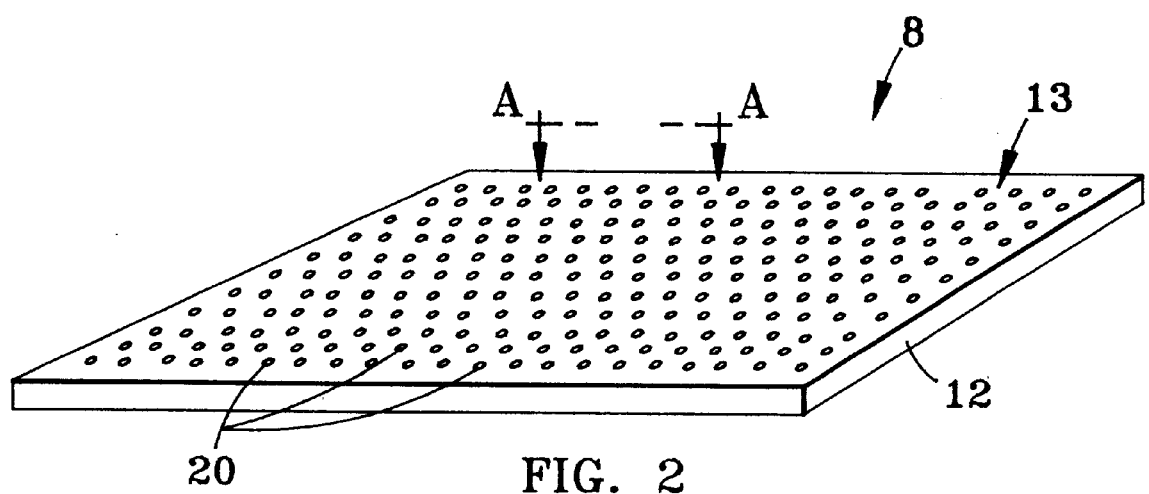
FIGS. 2, 2A and 2B are schematic drawings showing the pupil imaging reticle of the present invention with enlarged views of the holes in the photomask which are spaced equidistant apart across the transparent substrate.

Once the light enters and passes through the condenser lens 7, the rays 3 are shaped and directed onto the reticle 8, which is positioned at the first focal plane 9. The reticle 8 is provided with a transparent substrate 12 and an opaque photomask 13 thereon, as shown in FIG. 2, which is applied in the conventional manner. A typical reticle can have opaque patterns on the photomask which blocks the light, while light is allowed to pass through the openings on the photomask, allowing patterns of light to pass through the reticle. The light which passes through the reticle, as shown in FIG. 1, can enter into the projection lens 15, which is typically positioned between the reticle and the wafer plane 10.

The projection lens, which can be of virtually any conventional design, has projection optics which redirect the pattern of light from the reticle directly onto the wafer 11, which is preferably positioned, in actual manufacturing applications, at the focal plane 16, but in the present invention, at the wafer plane 10, for defocusing, as will be discussed. The light illuminating the wafer plane 10 exposes the photoresist or other light sensitive film on the wafer 11, or other substrate, in the conventional manner. The projection optics typically include an entrance and exit pupil plane which are conjugated to one another so that an image projected into one plane will appear substantially unchanged at the other plane. The entrance pupil plane, upon which the image of the illumination pattern is formed, can be located at any position along the optical axis of the lens system, depending on the projection optics. For a double-telecentric projection lens, the entrance pupil is designed to be at infinity.

The process by which the pattern of light enters and passes through the reticle 8 and projection lens 15 can create rays of light which travel at various angles onto the wafer plane 10 so that optimum illumination can be provided for any given structure that is to be formed on the wafer 11. Non-standard patterns of illumination may provide improvements in the image formation for particular types of image patterns. In this respect, off-axis illumination, as discussed above, has been shown to be effective in achieving the best resolution for some applications. With the creation of these complex illumination patterns and angles, however, comes the need to carefully control the uniformity and constancy of the illumination across the entire exposure field to ensure that the exposure of light to the wafer is uniformly accomplished to give the best results.

The degree of coherence of the illumination can also have a significant effect on the image formation. When the degree of coherence is too high, for example, the image profile tends to oscillate near the corners, and faint ghost images can appear in adjacent areas, forming what is commonly known as "ringing." When the degree of coherence is too low, on the other hand, excessive rounding of the corners of the printed image, as well as a loss of contrast on the image boundaries, can be created. The degree of coherence is determined by the pupil filling ratio of the illuminator 2. This ratio can determine the extent to which light is either concentrated in the center of the pupil, in which case the light is said to be totally coherent, or spread throughout the entire pupil, in which case the light is said to be totally incoherent. Partially coherent illumination, which is somewhere in between, is often a preferred result because of the greater image contrast that can result which is especially useful where complex structural features are involved. No matter what distribution of illumination is chosen, it is important that the illumination pattern not change from one part of the exposure field to another.

The reticle 8 of the present invention can be used to measure and analyze the illumination pattern at the pupil plane to determine whether the equipment is functioning properly, whether there are defects in the illuminator system, and whether the illumination is uniform and of sufficient quality over the entire exposure field. As shown in FIG. 2, the reticle 8 of the present invention is formed in the conventional manner, with a transparent mask substrate 12 and opaque photomask 13 placed directly on one surface of the substrate. The photomask is preferably an extremely thin layer of opaque material, which is important in allowing the illumination to pass through the openings and/or other formations on the photomask at virtually any angle, and can be made of virtually any thin suitable material, including a conventional opaque chrome mask. In actual use, the reticle 8 is preferably positioned with the mask facing away from the light source, with the photomask being positioned at the focal plane 9 perpendicular to the axis. The reticle can, however, be in the reverse position, so long as the photomask is at or near the focal plane as is understood in the art.

Figure 2A:
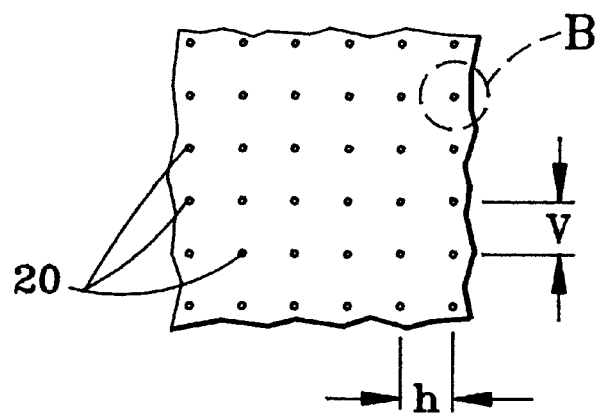
Figure 2B:
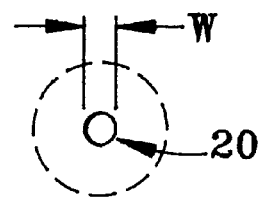

As shown in FIGS. 2, 2A and 2B, rather than having patterns and other formations formed onto the photomask, as in normal applications, the reticle 8 of the present invention has a plurality of holes 20 each being very small or having a very small diameter. The holes can be etched or otherwise formed on the photomask in the conventional manner. The holes can be positioned on the reticle in rows, as shown in FIG. 2A, where the space between each hole and row, both horizontally (h) and vertically (v), is substantially the same. The holes, however, can be positioned in virtually any pattern, so long as there is a sufficient number of holes to cover the reticle in a manner that will enable the images, which the holes create, to extend substantially across the entire exposure field, for sufficient sampling density. As discussed above, the design of lithographic projection lenses and illuminators are such that it is possible for the effective pupil illumination to vary undesirably from one position in the exposure field to another. By covering the reticle with a sufficient number of holes, the entire exposure field can be inspected for consistency.

Figure 7:
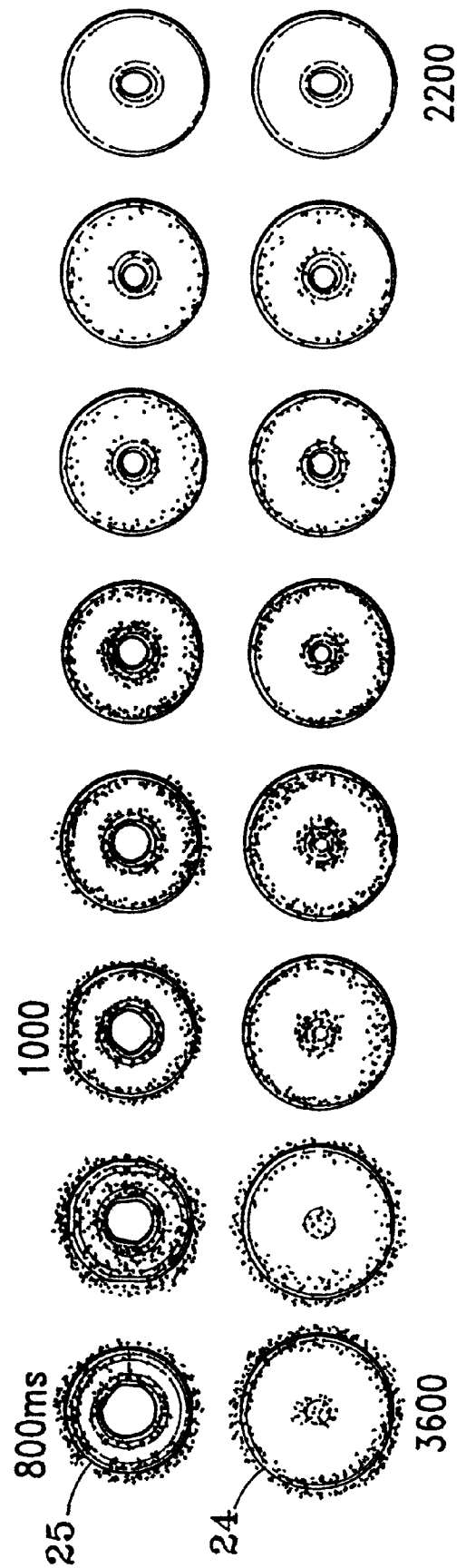
FIG. 7 is a representation of a series of exposures in photoresist made with a projection through a single aperture in the reticle, moved across the wafer plane at a substantially constant defocus distance, while exposing the wafer to different doses of illumination from one image to another. This drawing shows the annular distribution of the pupil illumination for the stepper being used.
Figure 8:
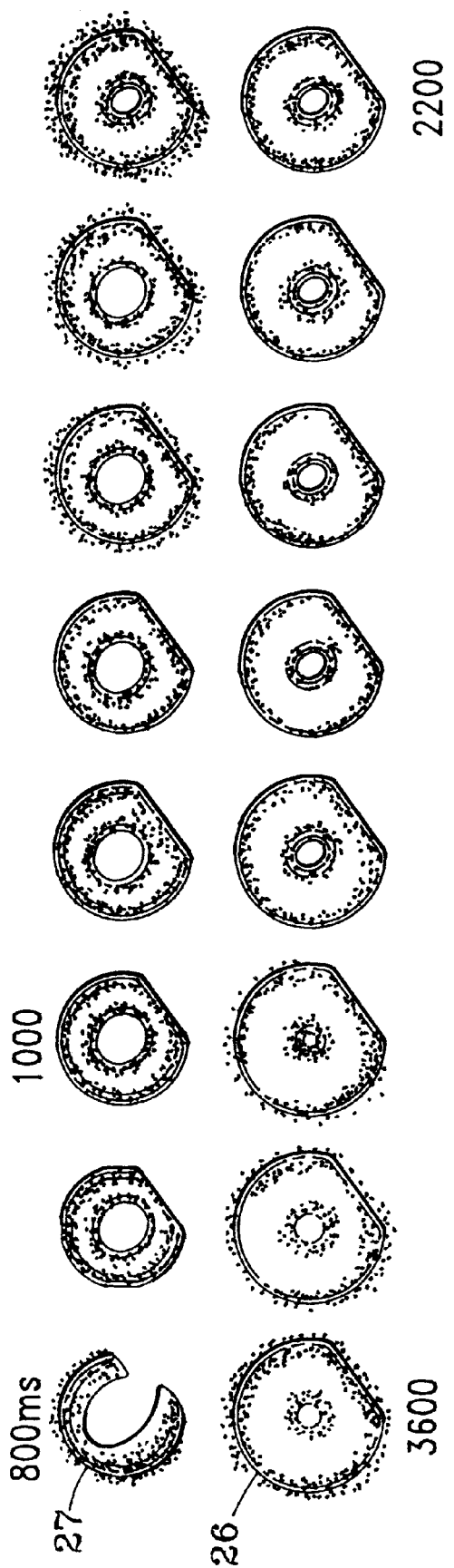
FIG. 8 is a representation of a series of exposures in photoresist made with a projection through a single aperture located near the edge of the reticle, moved across the wafer plane at a substantially constant defocus distance, while exposing the wafer to different doses of illumination from one image to another. This drawing shows the annular distribution of the pupil illumination with a defect in the illumination pattern.

The spacing of the holes on the reticle, however, is preferably far enough apart so that the images created by the holes do not interfere with one another. The optimum spacing distance is a function of the size of each of the holes, as well as the amount of defocusing that is used, as will be discussed, which can form different size enlarged images on the wafer plane. For example, using the stepper system that the inventor has tested, when the holes are about 3.0 microns in diameter, and the defocus distance is about 12 microns, the holes are spaced apart about 150 microns, although distances between 100–200 microns, and virtually any range between about 10 to 10,000 microns, or more, is acceptable in most cases. FIG. 2B shows a hole 20 with a diameter W, which in the test case is 3.0 microns, spaced 150 microns apart (h and v) from center to center, extending in a grid pattern, which is the preferred way of setting up the reticle. Another consideration is that the holes should be spaced far enough apart so that multiple exposures of different doses, as shown in FIGS. 7-8, can be used to form multiple images of each hole on the exposure field. This allows for even greater sampling of the field at differing exposures. In addition, from a practical standpoint, too many images can make it difficult to make a quick reading.

The diameter W or size and shape of each hole 20 is preferably identical so that the images created by each hole can be compared for inconsistencies. Each hole is preferably in the shape of a circle, although other shapes, such as squares and other geometric shapes, which allow a consistent amount of light to pass through, can be used. The diameter of the holes can range from 1 micron or less, to 5 microns or more, depending on the amount of defocus distance. The purpose of forming small holes having extremely small diameters is to use the holes as pinhole cameras which can record what the pupil fill of the lithographic lens system at the pupil plane looks like at any given point on the exposure field. In contrast to previous techniques, such as wafer-plane power meters, etc., which measure the illumination uniformity at the wafer plane, the present invention measures the illumination pattern at the pupil plane, which can be located at any point along the optical axis from zero to infinity, within or outside the illuminator optics of the projection lens 15. The defocused image formed by each of the holes is essentially the image of the illumination pattern in the pupil plane of the projection lens that is created by the illuminator source, as modified by the aperture stop and the condenser lens.

An important aspect of the present invention is that the image created by the holes must be defocused. Defocusing can simply be accomplished by positioning the wafer plane 10 away from the focal plane 16, where the wafer plane 10 positioned at the focal plane 16, the images formed by the holes would be in focus, and the formed images would merely be reproductions of the holes. Such images would not be helpful in measuring the varied illumination patterns that can exist in the pupil fill, which can be a partially coherent circular pattern of illumination, or other illumination patterns, which have been discussed. By defocusing the image of the hole, an image of the pupil illumination pattern is created, and in this manner, the pattern, including partially coherent and incoherent illumination patterns, etc., can be measured quantitatively. The resolution of the image is limited by diffractive blurring, and by the geometrical blurring, of the pin hole image formation.

Due to physical restraints in the assembled system 1, including the design of the reticle 8, and the amount of space within which the wafer chuck assembly can be maneuvered away from the focal plane, the amount of defocus that can actually be achieved may be limited with any given system. Because of the small size of the holes used in the present invention, however, the amount of defocus distance required is relatively small enough that the wafer chuck assembly should not have to be removed from the system, as in previous methods.

For any particular amount of defocus, there is an optimum size hole. If the hole is too large, for example, in relation to the amount of defocus, geometrical blurring equal to the size of the hole can be created. On the other hand, if the hole is too small, in relation to the amount of defocus, diffractive blurring equal to approximately 2×D×Lambda/W, where D is the defocus, Lambda is the wavelength, and W is the width or diameter of the hole, is created. Tests have shown that the optimum result is achieved when the amount of diffractive blurring is substantially equal to the amount of geometrical blurring, which occurs when W=the square root of 2×D×Lambda.

The optimum hole size for a 12 micron defocus, for example, on the in-line stepper that the inventors have tested, has been shown to be about 3.0 microns. This amount, of course, will vary depending on the type of stepper being used. The pupil illumination image of each hole that is formed at this setting will have a diameter of about 7.2 microns, based on a 0.5 NA stepper operating at a wavelength of 365 nanometers with a partial coherence of 0.6 sigma. For these conditions, the diffractive blur and geometrical blur will be equal. Although the quality of the pupil image is relatively low given these settings, the resolution is sufficient to allow any inconsistencies between the many images projected onto the wafer plane to be made visible.

The optimum amount of defocus can also depend on the amount of exposure that is necessary to form the required resolution of the image. When the amount of defocus is increased, for example, which is determined by how far away the wafer plane is moved from the projection lens, the exposure time and/or intensity or dosage of the illumination needed to create an acceptable image may have to be increased. This is because, for any given size hole 20, the amount of exposure that is needed increases as the square of the defocus distance. Accordingly, if high amounts of defocus are required, it may become impractical to use the present invention with a standard photoresist and normal lithographic processes, in that the required exposure and/or intensity of dosage may become too high.

The present invention, however, can be used within a relatively large range of acceptable hole sizes and defocus distance amounts, as determined by the factors discussed above. The following table shows the relationship between defocus distance, optimum hole size, image size, resolution and dose.

| Defocus | Optimum contact hole size | Image size | Resolution (percent of image size) | Dose (multiple of litho dose) |
|---|---|---|---|---|
| 10 μm | 3.0 μm | 6 μm | 64% | 6X |
| 100 μm | 8.5 μm | 60 μm | 20% | 51X |
| 1 mm | 27.0 μm | 600 μm | 6.4% | 500X |
| 10 mm | 85 μm | 6 mm | 2.0% | 5000X |

What is important is not so much the actual resolution of any particular image created by the holes, but the overall consistency of the resolution across the exposure field and, at a minimum, the ability to compare the images across the entire exposure field, to verify that the pupil illumination pattern is uniform and consistent throughout. Accordingly, even very low levels of resolution and image sizes are acceptable. Nevertheless, resolution can be improved by increasing the size of the holes and correspondingly increasing the defocus distance.

Figure 3:
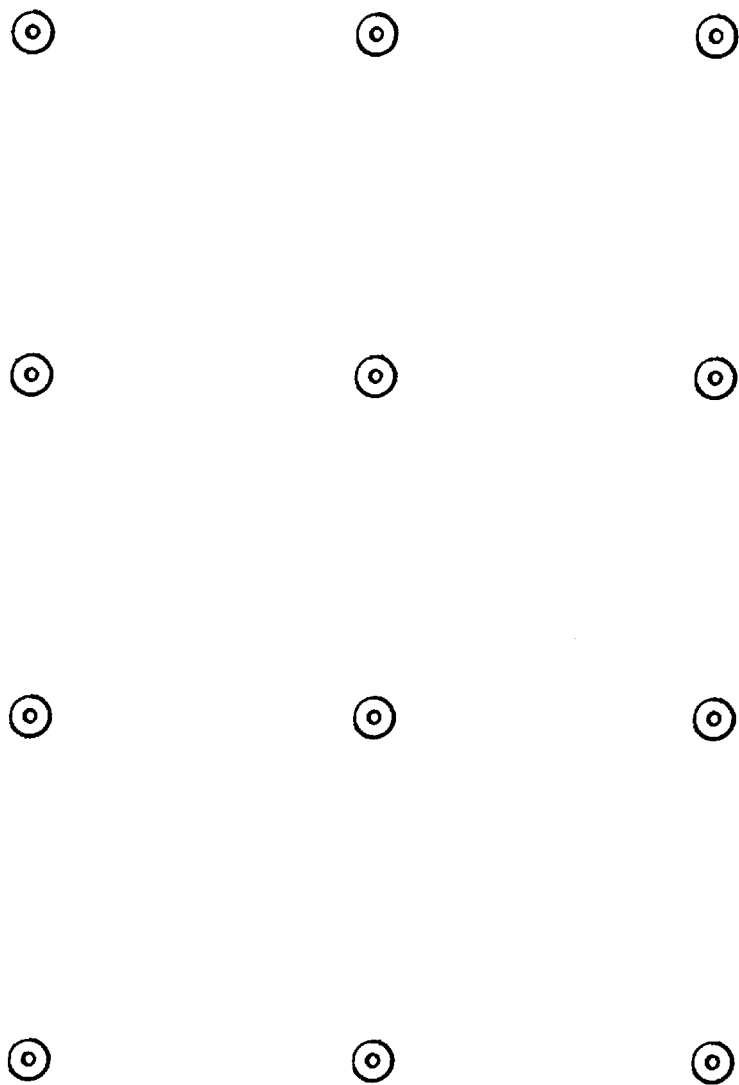
FIG. 3 is a representation of an array of hole images that have been projected and formed on the wafer using the photo imaging reticle of the present invention. This drawing shows images having circular shapes which were formed with a stepper having an annular distribution of the pupil illumination.

FIG. 3 shows a representation of an array of images 21 formed on a test wafer by projections created by the reticle 8. The spacing of the holes, as indicated by this representation of an actual photoresist image, is substantially equidistant in both horizontal and vertical directions. This particular sample is taken from somewhere on the exposure field and is an enlarged representation of twelve images created by twelve holes projecting substantially identical images of the pupil illumination. The substantial uniformity of the images would indicate that, at least over this portion of the exposure field, the pupil illumination pattern is substantially uniform. All of the images across the entire exposure field, however, would have to be examined and compared to determine whether the pupil illumination pattern is uniform throughout the exposure field. If any of the images are not identical in shape or size, a conclusion can be reached that the illumination pattern at the pupil plane is not uniform to that extent. This would demonstrate that the illumination pattern at the pupil plane being projected through the projection lens has deviated from the intended pattern of illumination in that area of the exposure field. This would also indicate that there may be a defect or other problem with the system, giving notice to the user that the system should be checked.

Figure 4:
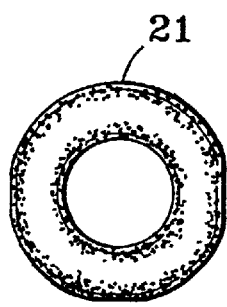
FIG. 4 is a representation of a single image, taken from an array of images, that has been projected and formed near the center of the exposure field, wherein the pupil illumination pattern is substantially symmetrical and uniform in shape. The circular shape of the image is formed with a stepper having an annular distribution of the pupil illumination.

FIG. 4 shows an enlarged image 21, taken from an array of images, created on the test wafer by one of the multiple holes 20 on the reticle 8. This representation of an actual sample is taken from somewhere near the center of the exposure field and indicates that the pupil illumination being projected at that point on the exposure field is substantially symmetrical and relatively free of defects. Of course, looking at only one image only provides information about that particular location on the exposure field. To gather information about the uniformity of the pupil illumination pattern across the entire exposure field, images across the entire field would have to be inspected and compared.

Figure 5:
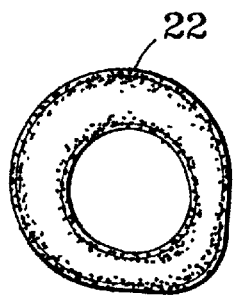
FIG. 5 is a representation of a single image, taken from an array of images, that has been projected and formed away from the center of the wafer, but within the exposure field, wherein the pupil illumination pattern is slightly deformed. The substantially circular shape of the image is formed with a stepper having an annular distribution of the pupil illumination.

FIG. 5 shows an enlarged image 22, taken from an array of images, created on the wafer by one of the multiple holes 20 located away from the center of the reticle 8, although within the usable part of the exposure field. This representation of an actual sample indicates that there may be some defects in the system due to the irregularity of the shape and size of the image. Because the irregularity is found in the usable part of the exposure field, this particular sample indicates that something should be done to correct the irregularity, or risk the possibility that the images illuminated on the wafer plane will not be consistent across the entire exposure field. An analysis of this particular image shows that there may be too much energy, or at least a disproportionate amount, being distributed onto one portion of the illumination pattern than another, due to the lopsided shape of the image formation.

Figure 6:
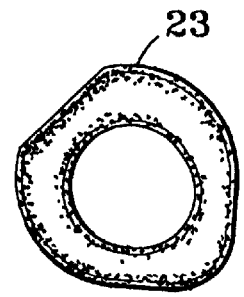
FIG. 6 is a representation of a single image, taken from an array of images, that has been projected and formed near the edge of the wafer, outside the exposure field, wherein the pupil illumination pattern is defective. The substantially circular shape of the image is formed with a stepper having an annular distribution of the pupil illumination.

FIG. 6 shows an enlarged image 23, taken from an array of images, created on the wafer by one of the multiple holes 20 located near the edge of the reticle 8, outside the usable part of the exposure field. This representation of an actual sample indicates that there may be some defect or obstruction in the system due to the severity of the deformity on one side of the image. Because this image is taken outside of the usable part of the exposure field, however, it does not conclusively show that there is a defect in the system that will cause the actual illumination of the wafer to be inconsistent. It may simply show that there is an obstruction outside of the exposure field which will not interfere with the uniformity of the pupil illumination pattern across the usable part of the exposure field.

FIG. 7 shows a series of images formed during testing of the present invention using an annular aperture stop. This representation is of actual images that were made using a single hole, cast at different intervals on the stepper, using different exposure doses, which accounts for the differences in the image sizes and/or resolutions from one image to another. The image 24 was formed with the greatest amount of exposure and image 25 was formed with the least amount of exposure. The images in between were formed using progressively greater amounts of exposure, from the image 25 to image 24. This shows that the images can have different resolutions and sizes depending on the exposure or dose. Note that the images formed are substantially donut in shape, which is essentially the shape of the illumination pattern formed by the annular opening of the aperture stop in the illuminator.

FIG. 8 shows a series of images formed in the same manner as the images shown in FIG. 7, but taken from the edge of the exposure field, i.e., images formed by a single hole positioned along the edge of the reticle 8. The imperfections in the images show that the illumination pattern is defective or otherwise irregular, at least along that edge of the exposure field. The image 26 was formed using the greatest amount of exposure and the image 27 was formed using the least amount of exposure. Note that with the lowest exposure, the image 27 is smaller than the image 26, although it is sufficient to show the defective shape of the image clearly.

The present invention can be used by placing the pupil imaging reticle 8 with multiple holes 20 into position in the usual manner onto the system assembly. As with standard reticles, the reticle 8 is positioned so that the photomask is positioned directly at the first focal plane 9. The size of the holes 20 on the reticle 8 is determined by the optimum defocus distance. Once the size of the holes is determined in conjunction with the defocus distance, the image size, resolution and dose, to provide the best possible image formations, is determined. For example, in the test stepper, where the defocus distance is about 12 microns, the holes preferably have a diameter of about 3.0 microns, and the dose is preferably about 6 times the normal lithography dosage, which combine to create an image that is about 6 microns in size and having a resolution of about 64 percent of image size.

Once the settings are known, the distance of the wafer plane from the projection lens, and/or the exposure time or dose, in relation to normal dosages, can be adjusted accordingly and set. With the proper settings, the wafer 11 can be exposed in the usual manner by illuminating the wafer plane, using the system to form the test images on the wafer that can be measured and analyzed for uniformity and consistency. As with standard wafers having photoresist or other light sensitive materials thereon, the light creates images on the wafer that can be developed through standard lithography processes and analyzed. The test and sampling can be repeated using different settings, such as different exposures and/or doses, as shown in FIGS. 7-8, to determine if the illumination is consistent at various exposures. Additional testing can also be performed using different defocus amounts with correspondingly different hole sizes if desired.

As discussed above, the analysis comprises inspecting each of the images on the wafers formed by the holes and determining whether there are any inconsistencies between the images. If the images are consistent throughout the exposure field, the illumination pattern at the pupil plane is most likely substantially uniform and of sufficient quality in that respect. If the images are not consistent throughout the exposure field, however, and have some inconsistencies, the illumination pattern at the pupil plane cannot be said to be uniform. In such case, this is evidence that the equipment is not operating properly or may need to be adjusted, or that there may be a defect in the lens, or some other part of the system.

What is claimed is:

1. A device for measurement of pupil plane illumination comprising:

a pupil imaging reticle, wherein said pupil imaging reticle comprises a plurality of holes, wherein each hole has about a same predetermined size and shape, wherein said holes are spaced on said reticle a predetermined distance, said distance being sufficient for providing adequate sampling density such that an invariance of a pupil plane illumination pattern across an entire exposure field of the pupil plane illumination can be determined and that an irregularity within the pupil plane illumination pattern can be determined, yet far enough apart to ensure interference does not occur on said exposure field.

2. The device of claim 1, wherein said exposure field is located at a predetermined defocus distance from a focal plane within said device wherein an optimum hole size is dependent on the defocus distance and on a wavelength of said pupil plane illumination, and wherein said dependence is determined by substantially equating a diffractive blurring of the pupil plane illumination to a geometrical blurring of the pupil plane illumination.

3. The device of claim 1, wherein said holes are circular in shape and have a predetermined diameter of between about 1–5 microns.

4. The device of claim 1, wherein said predetermined distance of said holes is between about 100–200 microns.

5. A method for measurement of pupil plane illumination comprising:

providing a pupil imaging reticle having a plurality of holes, wherein each hole has about a same predetermined size and shape;

providing a lithographic lens having a pupil and an illuminator of the lithographic lens;

providing a wafer having a photoresist thereon;

illuminating said wafer through said pupil imaging reticle, defocused from a focal plane of the lithographic lens, to form and record an illumination pattern on said photoresist, wherein said illumination pattern is formed without removing the wafer from the system; and inspecting the illumination pattern of the lithographic lens as recorded on the photoresist to determine if the illumination pattern is invariant across the entire wafer and if an irregularity is present in the illumination pattern.

6. The method of claim 5, further comprising the step of:

predetermining a hole diameter based on the amount of lens defocus and on a wavelength of said illumination, wherein an optimum hole diameter is determined by substantially equating a diffractive blurring of the illumination pattern to a geometrical blurring of the illumination pattern; and forming the plurality of holes having about the same size and shape in accordance with said predetermined diameter.

7. The method of claim 5, wherein said illumination pattern includes pupil images, and further comprising the step of predetermining a spacing between said holes such that adequate sampling density of the illumination pattern is provided while keeping the pupil images spaced far enough apart such that no interference is present between the pupil images.

8. A method for measuring the pupil plane illumination comprising:

providing a reticle having a plurality of holes, wherein each hole has about a same predetermined size and shape;

providing a stepper including a lithographic lens having a pupil and an illuminator of the lithographic lens;

illuminating a substrate having a photoresist thereon through said reticle, wherein the pupil plane illumination is defocused from the focal plane of the lithographic lens, to form a pupil illumination pattern comprising a series of pupil illumination images on the photoresist of an exposure field on said substrate, and wherein the stepper is not disturbed, and inspecting the pupil illumination pattern to determine if the illumination pattern is invariant across the entire exposure field and if an irregularity is present in the illumination pattern.

9. The method of claim 8, further comprising the step of:

predetermining a size of each hole based on an amount of lens defocus and on a wavelength of said pupil illumination, wherein an optimum hole size is determined by substantially equating a diffractive blurring of the pupil illumination pattern to a geometrical blurring of the pupil illumination pattern.

10. The method of claim 8, further comprising the step of predetermining a spacing between said holes such that adequate sampling density is provided on the pupil illumination pattern while keeping the pupil illumination images spaced far enough apart such that no interference is present between the pupil illumination images.

11. The method of claim 8, wherein the substrate is a wafer.

12. The method of claim 8, wherein the illuminating step further comprises moving a stepper interval to form illumination patterns on the photoresist using a different exposure dose at each stepper interval.

13. The method of claim 8, further comprising the step of setting a photoresist exposure dosage as a function of the size and resolution of the images desired.

14. The method of claim 8, further comprising the step of predetermining an amount of photoresist exposure based on an amount of defocus distance, wherein the amount of exposure varies as the square of the defocus distance.

15. A photo lithographic lens system, comprising:

a lithographic lens having a pupil and an illuminator upon the lithographic lens;

a pupil imaging reticle positioned at a first focal plane, said reticle having a plurality of holes therein, wherein each hole has about a same size and shape, and wherein the holes are spaced a predetermined distance apart;

a substrate having a photoresist thereon; and wherein said substrate can be illuminated through said pupil imaging reticle, defocused from a focal plane of the lithographic lens by a predetermined defocus distance, to form a pupil illumination pattern that is recorded on the photoresist, wherein the pupil illumination pattern is formed without removing the substrate from the system, and wherein the pupil illumination pattern can be inspected to determine whether the pupil illumination pattern varies across the photoresist and whether an irregularity is present in the illumination pattern.

16. The system of claim 15, wherein the pupil illumination pattern includes pupil images, and wherein the holes are positioned on the reticle in a manner that provides adequate sampling density of the pupil illumination pattern, such that the pupil images are spaced far enough apart that no interference is present between the pupil images.

17. The system of claim 15, wherein a size of each hole is predetermined based on the defocus distance and on a wavelength of said illumination, and wherein an optimum hole size is determined by substantially equating a diffractive blurring of the pupil illumination pattern to a geometrical blurring of the pupil illumination pattern.

18. The system of claim 17, wherein the optimum hole size is proportional to about the square root of the defocus distance, and wherein the optimum hole size is proportional to about the square root of the wavelength.

* * * * *